US012656372B2

(12) United States Patent
Lin et al.

(10) Patent No.: US 12,656,372 B2
(45) Date of Patent: Jun. 16, 2026

(54) PROBE CARD FOR FINE PITCH CIRCUIT PROBE TESTING OF SEMICONDUCTOR INTEGRATED CIRCUIT DEVICES AND METHODS OF FORMING THE SAME

(71) Applicant: Taiwan Semiconductor Manufacturing Company Limited, Hsinchu (TW)

(72) Inventors: Yuan-Li Lin, Taichung City (TW); Hsiao Kang Li, Taoyuan City (TW); I-Te Lee, Kaohsiung City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 284 days.

(21) Appl. No.: 18/110,176

(22) Filed: Feb. 15, 2023

(65) Prior Publication Data

US 2024/0272200 A1 Aug. 15, 2024

(51) Int. Cl.
*G01R 1/073* (2006.01)
*G01R 3/00* (2006.01)
*G01R 31/28* (2006.01)

(52) U.S. Cl.
CPC ........... *G01R 1/07342* (2013.01); *G01R 3/00* (2013.01); *G01R 31/2889* (2013.01)

(58) Field of Classification Search
CPC ........................ G01R 1/07342; G01R 31/2889
See application file for complete search history.

(56) References Cited

U.S. PATENT DOCUMENTS

| | | | | |
|---|---|---|---|---|
| 5,502,397 A | * | 3/1996 | Buchanan | G01R 31/31905 |
| | | | | 324/762.01 |
| 5,786,701 A | * | 7/1998 | Pedder | G01R 1/07314 |
| | | | | 324/756.05 |
| 6,292,003 B1 | * | 9/2001 | Fredrickson | G01R 1/0483 |
| | | | | 324/750.25 |
| 2002/0011860 A1 | * | 1/2002 | Hamren | G01R 31/2887 |
| | | | | 324/750.25 |
| 2003/0085722 A1 | * | 5/2003 | Rutten | G01R 1/07342 |
| | | | | 324/754.07 |
| 2005/0156611 A1 | * | 7/2005 | Shinde | G01R 1/07378 |
| | | | | 324/756.03 |
| 2006/0132160 A1 | * | 6/2006 | Kinoshita | G01R 1/0483 |
| | | | | 324/756.02 |

(Continued)

*Primary Examiner* — Paresh Patel
(74) *Attorney, Agent, or Firm* — The Marbury Law Group, PLLC

(57) ABSTRACT

A probe card for use in circuit probe testing and methods of fabrication thereof. The probe card includes a circuit board, an interposer structure that is mounted to the circuit board, and a probe structure mounted to the interposer structure and including a probe substrate, a redistribution layer over the probe substrate, and a plurality of probe pins over the redistribution layer. The interposer structure may include a plurality of elastically-deformable interposer pins electrically connecting the circuit board to the probe substrate. The center-to-center spacing (i.e., pin pitch) between the interposer pins may be greater than the center-to-center spacing (i.e., a second pin pitch) between the probe pins. A probe card in accordance with various embodiments may enable circuit probe testing of a device-under-test with a pitch between adjacent probe pins that is less than 50 µm.

20 Claims, 11 Drawing Sheets

(56) References Cited

U.S. PATENT DOCUMENTS

| | | | |
|---|---|---|---|
| 2006/0186906 A1* | 8/2006 | Bottoms | G01R 1/07378 |
| | | | 324/755.05 |
| 2006/0214675 A1* | 9/2006 | Stillman | G01R 1/07378 |
| | | | 324/754.2 |
| 2008/0238458 A1* | 10/2008 | Eldridge | G01R 1/07364 |
| | | | 324/754.07 |
| 2012/0286817 A1* | 11/2012 | Duckworth | G01R 1/06711 |
| | | | 324/755.01 |
| 2013/0002282 A1* | 1/2013 | Kuo | G01R 31/2889 |
| | | | 324/754.07 |
| 2013/0234748 A1* | 9/2013 | Namburi | G01R 1/07378 |
| | | | 324/756.02 |
| 2014/0091827 A1* | 4/2014 | Hung | G01R 1/07378 |
| | | | 324/756.03 |
| 2018/0156841 A1* | 6/2018 | Neely | H01L 25/0655 |

* cited by examiner

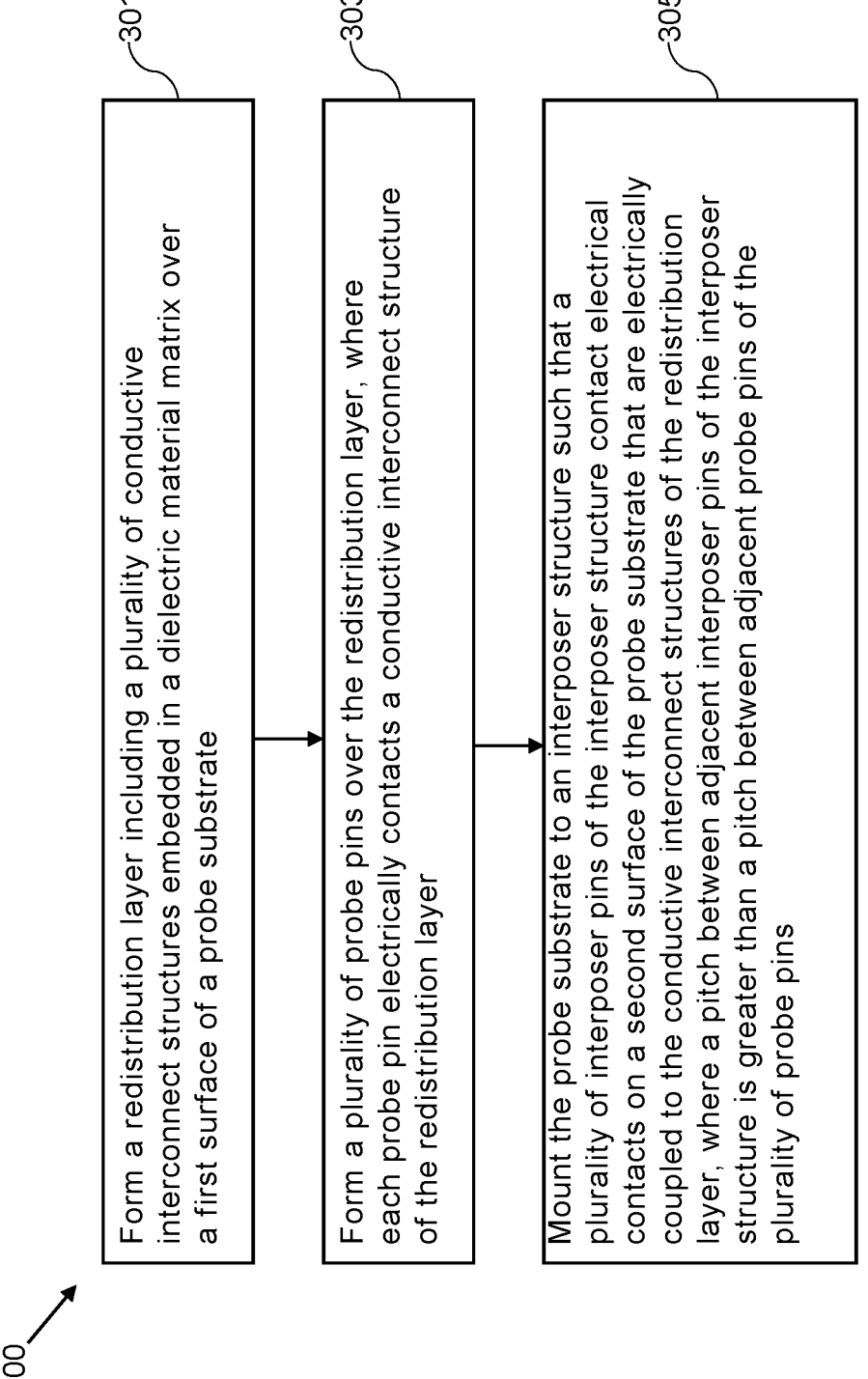

301 — Form a redistribution layer including a plurality of conductive interconnect structures embedded in a dielectric material matrix over a first surface of a probe substrate 303 — Form a plurality of probe pins over the redistribution layer, where each probe pin electrically contacts a conductive interconnect structure of the redistribution layer 305 — Mount the probe substrate to an interposer structure such that a plurality of interposer pins of the interposer structure contact electrical contacts on a second surface of the probe substrate that are electrically coupled to the conductive interconnect structures of the redistribution layer, where a pitch between adjacent interposer pins of the interposer structure is greater than a pitch between adjacent probe pins of the plurality of probe pins

PROBE CARD FOR FINE PITCH CIRCUIT PROBE TESTING OF SEMICONDUCTOR INTEGRATED CIRCUIT DEVICES AND METHODS OF FORMING THE SAME

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 is a flow chart illustrating steps of a method of fabricating a probe card for a circuit probe test system according to various embodiments of the present disclosure.

DETAILED DESCRIPTION

Figure 1:
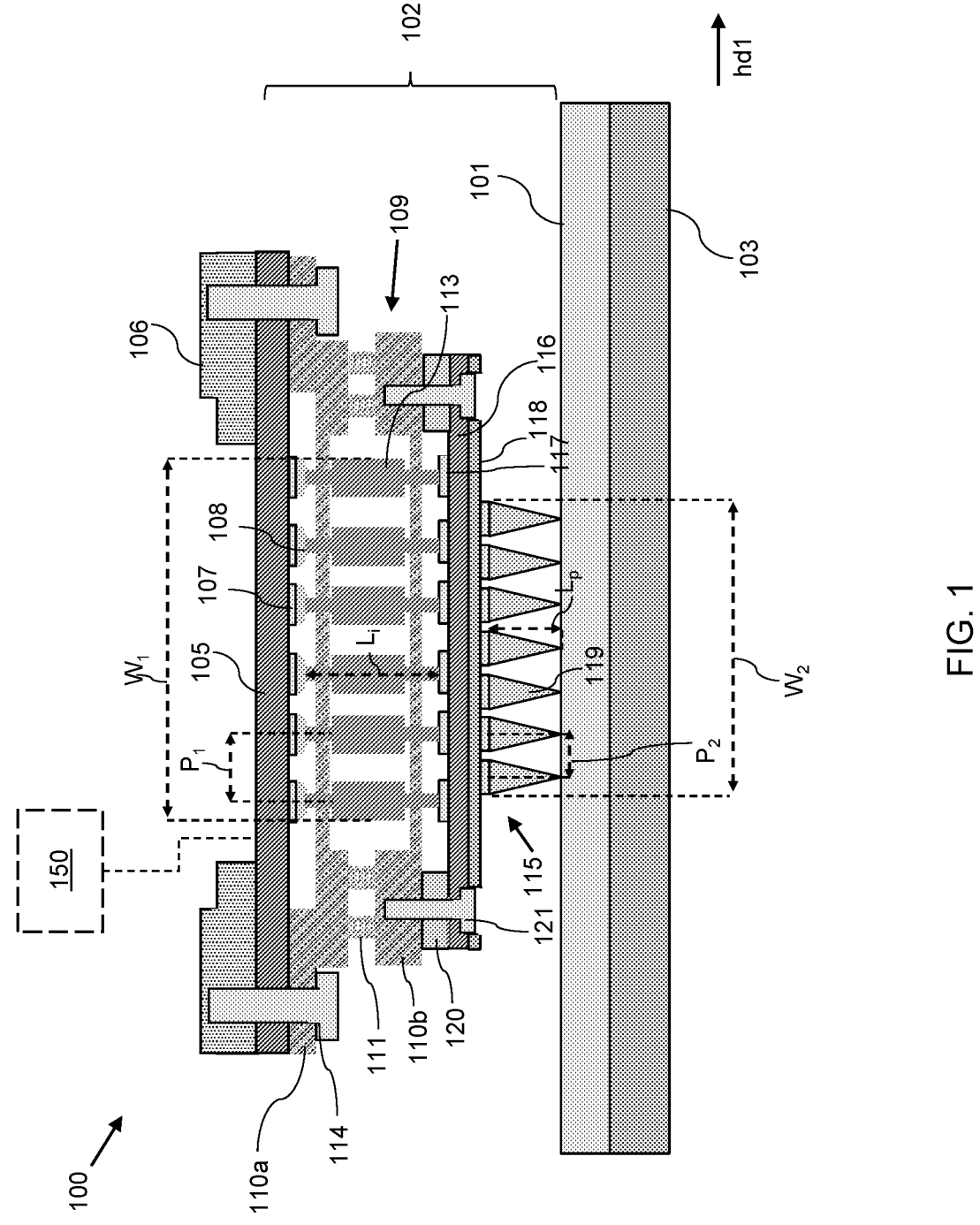
FIG. 1 is a vertical cross-section view of a portion of a circuit probe test system including a probe card that may be used to perform circuit probe testing of a device under test according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to circuit probe test systems for performing circuit probe testing of electronic devices, such as semiconductor integrated circuit devices, probe cards for use in a circuit probe test system, and methods of fabricating a probe card for use in a circuit probe test system.

Circuit probe testing is an important tool during fabrication of electronic devices, such as semiconductor integrated circuit (IC) devices. A circuit probe test system, which may also be referred as a wafer prober, is a specialized system used to test and validate the designed functionality of electronic circuits. Circuit probe testing may enable the identification of faulty or defective devices (e.g., semiconductor IC devices) at a relatively early stage of the overall production process (e.g., prior to wafer dicing or packaging), which may result in enhanced cost savings.

A circuit probe test system typically includes a probe card including a plurality of probe pins that may be placed in contact with contact pads on the device being tested. The probe card functions as an interface between the circuit probe test system and the device under test. The circuit probe test system transmits electrical test signals to the device under test through the probe card and detects electrical response signals from the device under test that are received through the probe card. A typical probe card includes a printed circuit board (i.e., a motherboard) that transmits the test signals and receives the response signals, a probe substrate having a first surface that is mechanically and electrically coupled to the motherboard (e.g., via solder connections) and a plurality of probe pins bonded to the second surface of the substrate. Each of the probe pins includes an elongate structure having a length of a millimeter or more, such as between 4 mm and 7 mm. The probe card typically also includes a probe head fixture including one or more ceramic guide plates having openings through which the probe pins extend. The probe head fixture is intended to maintain proper alignment of the probe pins during testing while still allowing the probe pins a degree of elastic deformability.

In an above-described probe card design, the minimum spacing or "pitch" between adjacent probe pins may be limited by the structure of the probe head fixture. In particular, the minimum pitch between pins is typically limited to 50 μm or more due to the material properties of the ceramic guide plates and currently-available drilling technology used to form the openings through the guide plates of the probe head fixture. Accordingly, such probe cards may not be satisfactory for performing circuit probe testing of emerging semiconductor IC device technologies having increased integration density that may include smaller and/ or more closely-spaced contact pads. In addition, the probe substrate to which the probe pins are attached has a limited lifetime because whenever broken probe pins need to be replaced, the entire probe card assembly must be disassembled to remove and replace the defective probe pins, and then must be reassembled using a high-temperature bonding process, such as a solder reflow process, which can result in thermal shock to the probe substrate. Repeated thermal impacts to the probe substrate may reduce the useful life of the probe substrate. Furthermore, current probe card designs often exhibit poor electrical performance due in part to a large impedance mismatch between the probe pins and the other components along the signal transmission path of the probe card.

Another type of probe card that is used for circuit probe testing is a membrane-type probe card. A drawback to this type of probe card design is that once the probe pins are broken, the entire membrane assembly may be discarded and replaced (i.e., it cannot be reworked), which can result in increased costs.

Accordingly, there is a need for improvements in circuit probe test systems to enable fine-pitch circuit probe testing of electronic devices, such as semiconductor IC devices, in a cost-effective manner. Various embodiments of the present disclosure include a probe card for use in a circuit probe test system and methods of fabrication thereof. In one embodiment, a probe card for a circuit probe test system may include a circuit board configured to be mounted to a mounting portion of a circuit probe test system. An interposer structure including a plurality of interposer pins may be mounted to the circuit board such that a first end of each of the interposer pins may electrically contact a respective first electrical contact on a surface of the circuit board. A probe structure including a probe substrate having a plurality of second electrical contacts on a first surface of the probe substrate may be mounted to the interposer structure such that a second end of each of the interposer pins may electrically contact a respective second electrical contact on the first surface of the probe substrate. The probe structure may further include a redistribution layer over a second surface of the probe substrate that is opposite the first surface, and a plurality of probe pins over the redistribution layer, where a first center-to-center spacing (i.e., a first pin pitch) between the interposer pins of the plurality of interposer pins may be greater than a second center-to-center spacing (i.e., a second pin pitch) between the probe pins of the plurality of probe pins. In some embodiments, the first pin pitch may be at least 50 μm, such as greater than about 100 μm, including about 300 μm or more, and the second pin pitch may be less than 50 μm, such as less than about 40 μm, including about 36 μm or less. In some embodiments, a length dimension of each of the interposer pins may be greater than a length dimension of each of the probe pins. In some embodiments, the length of the probe pins may be between about 10 μm and 100 μm. In some embodiments, a relatively shorter length of the probe pins may help to improve the impedance characteristics of the probe card.

A probe card in accordance with various embodiments of the present disclosure may enable circuit probe testing of a device-under-test with a pitch between adjacent probe pins that is less than 50 μm. The pitch of the probe pins may therefore be less than the minimum pitch of related probe card systems that include a probe substrate bonded to a circuit board with elastic probe pins extending from probe substrate through ceramic guide plates. In various embodiments, the redistribution layer located between the probe substrate and the probe pins may include a plurality of conductive interconnect structures embedded in a dielectric material matrix and electrically coupled to the probe pins. The redistribution layer may provide a "fan in" configuration that enables a reduced spacing between adjacent probe pins of the probe card. This may enable fine pitch (e.g., <50 μm) circuit probe testing with highly accurate alignment (e.g., ≤3 μm).

In various embodiments, the interposer structure of the probe card may mechanically and electrically couple the circuit board to the probe structure. The interposer structure may be configured to provide a degree of elastic deformability to the probe card to compensate for non-uniform surface planarity of the device-under-test. In some embodiments, the interposer structure may include an upper portion and a lower portion connected by one or more spring members. The interposer pins may be spring pins disposed between the upper portion and the lower portion of the interposer structure. In various embodiments, the probe structure, including the probe substrate, the redistribution layer and the probe pins, may be easily removable from the probe card, such as in the event of damage to one or more of the probe pins. In some embodiments, a defective probe structure may be repaired (e.g., by reworking the redistribution layer and/or the probe pins) and replaced in the probe card without causing thermal damage to the probe substrate. This may provide reduced costs compared to existing probe card devices.

FIG. 1 is a vertical cross-section view of a portion of a circuit probe test system 100 including a probe card 102 that may be used to perform circuit probe testing of a device under test (DUT) 101 according to various embodiments of the present disclosure. In some embodiments, the DUT 101 may include a semiconductor substrate, such as a silicon wafer, having circuit components formed on and/or within the semiconductor substrate. Other suitable structures for the DUT 101, such as semiconductor integrated circuit (IC) dies and/or semiconductor IC package structures, are within the contemplated scope of disclosure. The DUT 101 may be located on a lower support member 103, such as a wafer chuck.

Referring again to FIG. 1, the circuit probe test system 100 includes a probe card 102 that may be mounted to a mounting portion 106 of the circuit probe test system 100. In various embodiments, the probe card 102 may be mounted to the mounting portion 106 of the circuit probe test system 100 using suitable mechanical fasteners 114 that may enable the probe card 102, or a portion thereof, to be readily detached from the mounting portion 106 of the circuit probe test system 100. The circuit probe test system 100 may further include a system controller 150 that may be coupled to an actuator system (not shown) configured to move the mounting portion 106 and the probe card 102 along one or more horizontal directions with respect to the lower support member 103 in order to align the probe card 102 over selected regions(s) of the DUT 101. Alternatively, or in addition, the lower support member 103 may be moved to align the probe head 102 over selected region(s) of the DUT 101. In some embodiments, the system controller 150 of the circuit probe test system 100 may be operatively coupled to an optical detection system that may be used to align the probe card 102 over particular region(s) of the DUT 101 using optical pattern recognition. In some embodiments, the mounting portion 106 of the circuit probe test system 100 may form the distal end of a robotic arm.

The probe card 102 may include a circuit board 105, which may be a printed circuit board 105 having electronic circuit elements on and/or within the circuit board 105. The circuit board 105 of the probe card 102 may also be referred to as a "mother board" 105. A backside surface of the circuit board 105 may contact a flat lower surface of the mounting portion 106 of the circuit probe test system 100. In some embodiments, the backside surface of the circuit board 105 may be secured to the flat lower surface of the mounting portion 106 using a suitable adhesive, which may be in addition to or as an alternative to the mechanical fasteners 114 shown in FIG. 1. The circuit board 105 may be coupled to the system controller 150 of the circuit probe test system 100 via one or more electrical connections. A plurality of electrical contacts 107, such as bonding pads, may be located on a front side surface of the circuit board 105 facing the DUT 101.

Referring again to FIG. 1, the probe card 102 may further include an interposer structure 109 mounted to the front side surface of the circuit board 105. The interposer structure 109 may include an upper portion 110*a* mounted to the front side surface of the circuit board 105 (e.g., via mechanical fasteners 114 as shown in FIG. 1), a lower portion 110*b* located below the upper portion 110*a*, and a plurality of interposer pins 113 disposed between the upper portion 110*a* and the lower portion 110*b*. The upper portion 110*a* and the lower portion 110*b* of the interposer structure 109 may be composed of a suitable dielectric structural material, such as a plastic material. The interposer pins 113 may be composed of a suitable electrically-conductive material, such as a metal or metal alloy. In some embodiments, the interposer pins 113 may be elastically deformable along their length dimension $L_i$. For example, the interposer pins 113 may be spring pins, as described in further detail below. Each of the interposer pins 113 may include an upper portion that extends through an opening in the upper portion 110*a* of the interposer structure 109 and electrically contacts a respective electrical contact 107 on the front side surface of the circuit board 105. In the embodiment shown in FIG. 1, bonding material portions 108 may mechanically and electrically couple the upper portion of each of the interposer pins 113 to an electrical contact 107 (i.e., a bonding pad) on the front side surface of the circuit board 105. The bonding material portions 108 may include, for example, a solder material. Other suitable techniques may be used to mechanically and electrically couple the upper portions of the interposer pins to the electrical contacts 107 on the front side surface of the circuit board 105, such as the use of conductive adhesives, diffusion bonds, and the like.

In various embodiments, the lower portion 110*b* of the interposer structure 109 may be connected to the upper portion 110*a* of the interposer structure 109 by one or more spring members 111, such as disc springs. Other suitable spring members 111 are within the contemplated scope of disclosure. Thus, the lower portion 110*b* of the interposer structure 109 may have a limited range of motion with respect to the upper portion 110*a* of the interposer structure 109 (e.g., along a vertical direction) due to elastic deformation of the spring members 111. The upper portion 110*a* of the interposer structure 109 may be fixed relative to the circuit board 105 and the mounting portion 106 of the circuit probe test system 100.

Referring again to FIG. 1, the probe card 102 may further include a probe structure 115 mounted to the lower portion 110*b* of the interposer structure 109, such as by one or more mechanical fasteners 121 as shown in FIG. 1. The probe structure 115 may include a probe substrate 116. The probe substrate 116 may be composed of a suitable substrate material, such as a ceramic and/or an organic substrate material. Other suitable materials for the probe substrate 116 are within the contemplated scope of disclosure. In some embodiments, described in further detail below, the probe substrate 116 may include a multi-layer substrate structure, such as a multi-layer ceramic (MLC) and/or a multi-layer organic (MLO) substrate structure that may include conductive interconnect structures (e.g., conductive vias) extending through the probe substrate 116.

A plurality of electrical contacts 117, such as bonding pads, may be located on a back side surface of the probe substrate 116 facing the interposer structure 109. The electrical contacts 117 on the back side surface of the probe substrate 116 may each be coupled to one or more conductive interconnect structures (e.g., conductive vias) extending through the probe substrate 116. Each of the interposer pins 113 may include a lower portion that extends through an opening in the lower portion 110*b* of the interposer structure 109 and electrically contacts a respective electrical contact 117 on the back side surface of the probe substrate 116. Thus, each of the interposer pins 113 of the interposer structure 109 may electrically connect an electrical contact 107 on the front side surface of the circuit board 105 to a respective electrical contact 117 on the back side surface of the probe substrate 116. One or more spacers 120 may be provided between the back side surface of the probe substrate 116 and the lower portion 110*b* of the interposer structure 109, as shown in FIG. 1. Alternatively, the spacer (s) may be integrally formed as part of the probe substrate 116 and/or the lower portion 110*b* of the interposer structure 109.

In some embodiments, the lower portions of the interposer pins 113 that contact the electrical contacts 117 on the back side surface of the probe substrate 116 may not be bonded to the electrical contacts 117 via a method that requires high temperature bonding, such as reflow of a solder material. This may facilitate easy removal of the probe structure 115, including the probe substrate 116, from the remaining portion of the probe card 102. Further, the probe structure 115 including the probe substrate 116 may be removed and replaced multiple times without causing thermal damage to probe substrate 116 from a high-temperature bonding process (e.g., a reflow process). In some embodiments, the lower portions of the interposer pins 113 may contact the electrical contacts 117 on the back side surface of the probe substrate 116 but may not be bonded or otherwise attached to the electrical contacts 117.

Referring again to FIG. 1, the probe structure 115 of the probe card 102 may further include a redistribution (RDL) layer 118 over the front side surface of the probe substrate 116 facing the DUT 101. As described in further detail below, the RDL layer 118 may include a dielectric material matrix having a plurality of conductive interconnect structures extending therethrough. A plurality of probe pins 119 may be located over the front side surface of the RDL layer 118 facing the DUT 101. The probe pins 119 may include elongate structures composed of a suitable electrically conductive material, such as a metal or metal alloy. Each of the probe pins 119 may be electrically connected to an electrical contact 117 on the back side surface of the probe substrate 116 via the conductive interconnect structures extending through the RDL layer 118 and the probe substrate 116. Accordingly, each of the probe pins 119 may be electrically coupled to the circuit board 105 of the probe card 102 via an interposer pin 113 and the conductive interconnect structures extending through the probe substrate 116 and the RDL layer 118.

To perform a circuit probe test on a DUT 101, the system controller 150 of the circuit probe test system 100 may be configured to move the mounting portion 106 and the probe card 102 with respect to the DUT 101 to bring the tip ends of the probe pins 119 into contact with electrical contacts (e.g., bonding or contact pads) on the upper surface of the DUT 101. In some embodiments, this may include moving the probe card 102 in a vertically downward direction with respect to the DUT 101 such that each of the probe pins 119 contacts the upper surface of the DUT 101. The interposer structure 109 may be configured to provide a degree of elastic deformation to compensate for non-uniformities in the upper surface of the DUT 101, as described in further detail below. The circuit probe testing may include transmitting electrical signals (e.g., test patterns) to the DUT from the circuit board 105, through the interposer pin 113, the probe substrate 116, the RDL layer 118 and the probe pins 119 to the electrical contacts on the upper surface of the DUT 101 and detecting electrical response signals from DUT 101 via the probe pins 119, the RDL layer 118, the probe substrate 116, the interposer pins 113 and the circuit board 105. The detected response signals from the DUT 101 may be analyzed and used to determine whether or not the DUT 101 includes any functional defects. Based on circuit probe testing, multiple DUTs 101 may be sorted such that defective DUTs 101, or portions thereof, are not used in subsequent fabrication, distribution and/or commercialization processes.

In some embodiments, the interposer pins 113 of the probe card 102 may form a one-dimensional or two-dimensional array of interposer pins 113. The probe pins 119 of the probe card 102 may similarly form a one-dimensional or two-dimensional array of probe pins 119. In some embodiments, an area of the array of interposer pins 113 within a horizontal plane (i.e., a plane parallel to the first horizontal direction hd1 shown in FIG. 1) may be greater than the area of the array of probe pins 119 within a horizontal plane. In some embodiments, the array of interposer pins 113 may have a width dimension $W_1$ along at least one horizontal direction (i.e., hd1 in FIG. 1) that is greater than the width dimension $W_2$ of the array of probe pins 119 along the corresponding horizontal direction hd1. In some embodiments, a length dimension $L_i$ of the interposer pins 113 along the vertical direction may be greater than the length dimension $L_p$ of the probe pins 119 along the vertical direction. In some embodiments, the length dimension $L_p$ of the probe pins 119 may be greater than about 10 μm, such as between about 10 μm and about 100 μm.

In some embodiments, a center-to-center spacing, or pitch $P_1$, between adjacent interposer pins 113 of the array of interposer pins 113 may be greater than the pitch $P_2$ between adjacent probe pins 119 of the array of probe pins 119. In some embodiments, the pitch $P_2$ between adjacent probe pins 119 of the array of probe pins 119 may be less than about 50 μm, including less than about 40 μm (e.g., ~36 μm).

Accordingly, a probe card 102 according to various embodiments may enable circuit probe testing of a DUT 101 with a pitch $P_2$ between adjacent probe pins 119 that is less than 50 μm. The pitch $P_2$ of the probe pins 119 may therefore be less than the minimum pitch of current probe card systems that include a probe substrate bonded to a circuit board with elastic probe pins extending from probe substrate through ceramic guide plates. A probe card having a pitch of less than 50 μm according to various embodiments include an elastic deformable interposer structure 109 between the circuit board 105 and the probe substrate 116, and a redistribution layer 118 between the probe substrate 116 and the probe pins 119 that includes a "fan in" configuration that enables a reduced spacing between adjacent probe pins 119 of the probe card 102. This may enable fine pitch (e.g., <50 μm) circuit probe testing with highly accurate alignment (e.g., ≤3 μm). A probe card 102 according to various embodiments may be used to perform circuit probe testing on DUTs 101 having relatively small contact pads (e.g., 40 μm×40 μm or less).

In addition, providing the probe pins 119 on a probe substrate 116 that is separated from the circuit board 105 of the probe card 102 by an interposer structure 109 may enable improved impedance compared to existing probe card designs. This is because the impedance characteristics along the transmission pathway between the circuit board 105 and the probe pins 119 may be more effectively controlled. There is generally a relatively large impedance mismatch between the probe pins 119 and the other components of the probe card 102. The impact of this impedance mismatch may be reduced by minimizing the length of the mismatched segment of the transmission pathway (i.e., the probe pins 119) and/or by providing smoother transitions between impedance along the transmission pathway. In the embodiment probe card 102 as shown in FIG. 1, the probe pins 119 may be relatively short (e.g., ~10 μm to 100 μm) as compared to existing designs in which the substrate to which the probe pins are mounted is directly attached to the motherboard, and the probe pins may have lengths in the millimeter range (e.g., 4-7 mm). Further, since a redistribution layer 118 is used to electrically couple the probe substrate 116 to the probe pins 119, the redistribution layer 118 may be designed to provide a smoother transition in impedance between the probe pins 119 and the rest of the transmission pathway in the probe card 102.

Further, as discussed above, the probe structure 115 including the probe substrate 116, the redistribution layer 118 and the probe pins 119, may be easily removable from the probe card 102, such as in the event of damage to one or more of the probe pins 119. In some embodiments, a defective probe structure 115 may be repaired (e.g., by reworking the redistribution layer 118 and/or the probe pins 119) and replaced in the probe card 102 without causing damage to the probe substrate 116. This may be an improvement over membrane-type probe cards in which the entire membrane structure needs to be replaced in the event of damage to the probes.

Figures 2A, 2B:
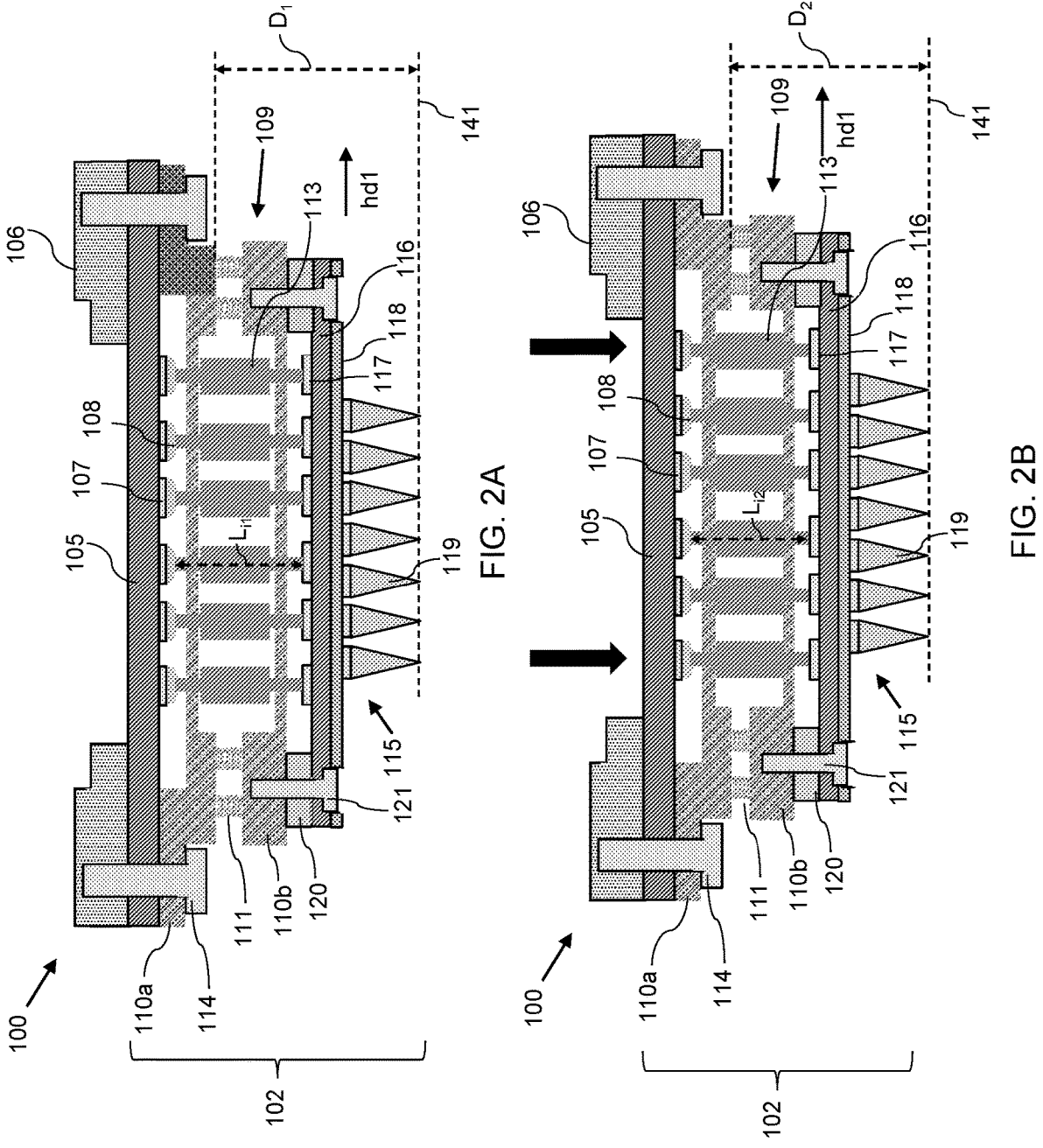
FIG. 2A is a vertical cross-section view of a portion of a circuit probe test system including a probe card in a non-elastically deformed state according to an embodiment of the present disclosure.
FIG. 2B is a vertical cross-section view of a portion of the circuit probe test system of FIG. 2A illustrating the probe card in a state of maximum elastic deformation according to an embodiment of the present disclosure.

FIG. 2A is a vertical cross-section view of a portion of a circuit probe test system 100 including a probe card 102 in a non-elastically deformed state according to various embodiments of the present disclosure. FIG. 2B is a vertical cross-section view of the portion of the circuit probe test system 100 of FIG. 2A with the probe card 102 undergoing a maximum amount of elastic deformation according to various embodiments of the present disclosure. Referring to FIGS. 2A and 2B, a probe card 102 according to various embodiments may include a degree of built-in elastic deformability to enable circuit probe testing of DUTs 101 having non-uniform planarity in the upper surface of the DUT 101. In particular, where there is a deviation in the planarity or flatness of the upper surface of the DUT 101, some localized higher-elevation regions of the upper surface of DUT 101 may be contacted by a probe pin 119 while in localized lower-elevation regions of the DUT 101 there may be a gap between the tip of the probe pin 119 and the upper surface of the DUT 101. The circuit probe test system 100 may compensate for this planarity difference by continuing to move the probe pins 119 vertically downwards relative to the DUT 101 to ensure that all regions of the DUT 101 undergoing circuit probe testing are contacted by a probe pin 119. This may result in excess force being applied to the probe pins 119 that contact localized higher-elevation regions of the upper surface of the DUT 101. This excess force on the probe pins 119 may be at least partially absorbed by the built-in elastic deformability of the probe card 102. In the embodiment shown in FIGS. 2A and 2B, for example, elastic deformability of the probe card 102 may be provided by the interposer structure 109, which includes elastically deformable spring members 111 connecting the lower portion 110b and the upper portion 110a of the interposer structure 109 and elastically deformable interposer pins 113 (e.g., spring pins) disposed between the lower portion 110b and the upper portion 110a of the interposer structure 109.

FIG. 2A illustrates the probe card 102 in a non-elastically deformed state (i.e., there is no elastic deformation of interposer structure 109). In the non-elastically deformed state as shown in FIG. 2A, there may be a vertical distance $D_1$ between the lower surface of the upper portion 110a of the interposer structure 109 and a horizontal plane 141 containing the tip ends of the probe pins 119. While the probe card 102 is in the non-elastically deformed state shown in FIG. 2A, the interposer pins 113 may have an initial length dimension $L_{i1}$. FIG. 2B illustrates the probe card 102 in a state of maximum elastic deformation (i.e., the interposer structure 109 is deformed by the maximum permissible amount). In particular, the spring members 111 may undergo elastic deformation such that the lower portion 110b of the interposer structure 109 may be vertically displaced towards the upper portion 110a of the interposer structure 109, and the interposer pins 113 may undergo elastic deformation such that a length $L_{i2}$ of the interposer pins 113 in the deformed state may be less than the initial length $L_{i1}$ of the interposer pins 113 in the non-deformed state of FIG. 2A. In the state of maximum elastic deformation shown in FIG. 2B, there may be a vertical distance $D_2$ between the lower surface of the upper portion 110a of the interposer structure 109 and the horizontal plane 141 containing the tip ends of the probe pins 119, where $D_2$ may be less than $D_1$. A difference between the vertical distance $D_1$ in the non-elastically deformed state and the vertical distance $D_2$ in the maximum elastically deformed state may be referred to as the "overtravel" distance of the probe card 102, which may represent the maximum variability in the planarity or flatness of the surface of the DUT 101 that the probe card 102 may accommodate during circuit probe testing. In various embodiments, the overtravel distance of the probe card 102 may be at least about 50 µm.

Figure 3A:
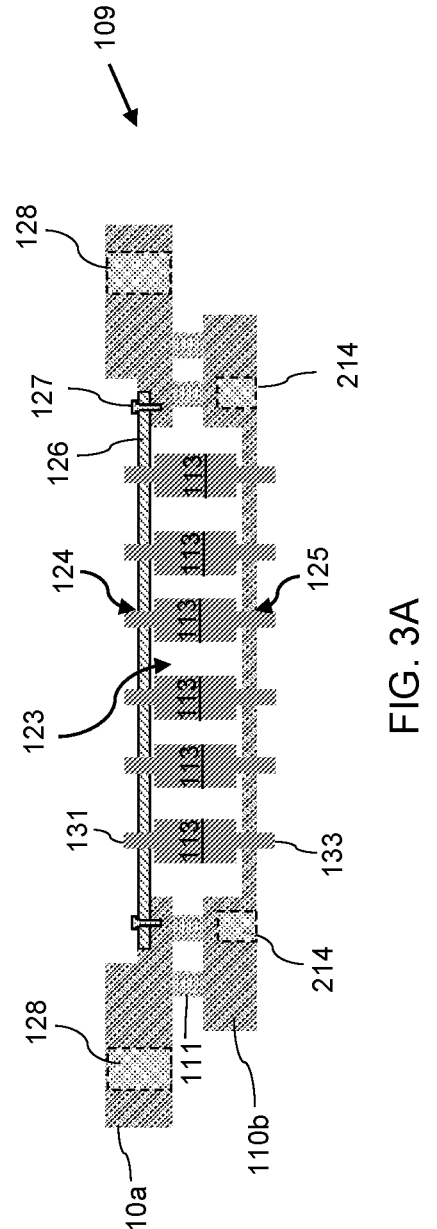
FIG. 3A is a vertical cross-section view of an interposer structure of a probe card according to an embodiment of the present disclosure.

FIGS. 3A-6 schematically illustrate a method of manufacture and assembly of a probe card 102 as described above in accordance with various embodiments of the present disclosure. FIG. 3A is a vertical cross-section view of an interposer structure 109, and FIG. 3B is a vertical cross-section view of an interposer pin 113 of an interposer structure 109 according to various embodiments of the present disclosure. Referring to FIG. 3A, an assembled interposer structure 109 is illustrated including an upper interposer portion 110a and a lower interposer portion 110b connected to the upper interposer portion 110a via springs 111, and a plurality of interposer pins 113 located between the upper interposer portion 110a and the lower interposer portion 110b. The lower portion 110b of the interposer structure 109 may include a plurality of openings 125, where each opening 125 is sized and shaped to receive a lower portion 133 of an interposer pin 113. The interposer pins 113 may have relatively narrow lower portions 133 and upper portions 131 with a central portion having a larger width dimension (e.g., diameter) along a horizontal direction hd1. Thus, the lower portions 133 of the interposer pins 113 may extend through the openings 125 in the lower portion 110b of the interposer structure 109, while the wider central portions of the interposer pins 113 may be prevented from passing through the openings 125. In the embodiment shown in FIG. 3A, the upper portion 110a of the interposer structure 109 may include a cover portion 126 having a plurality of openings 124, where each of the openings 124 in the cover portion 126 is sized and shaped to receive an upper portion 131 of an interposer pin 113. The cover portion 126 may be mounted over the interposer pins 113 (e.g., using suitable mechanical fasteners 127 as shown in FIG. 3A) such that the upper portions 131 of the interposer pins 113 extend through the openings 124. Thus, the relatively wider central portions of the interposer pins 113 may be confined within an enclosure 123 formed by the upper portion 110a and the lower portion 110b of the interposer structure 109, and the upper portions 131 and the lower portions 133 of the interposer pins 113 may extend outside of the enclosure 123.

Referring again to FIG. 3A, the upper portion 110a of the interposer structure 109 may include openings 128, such as threaded openings, that may be used for mounting the interposer structure 109 to the circuit board 105 and the mounting portion 106 of the circuit probe test system 100 as shown in FIG. 1. The lower portion 110b of the interposer structure 109 may include openings 214, such as threaded openings, that may be used to mount the probe portion 115 to the interposer structure 109 as shown in FIG. 1.

Figure 3B:
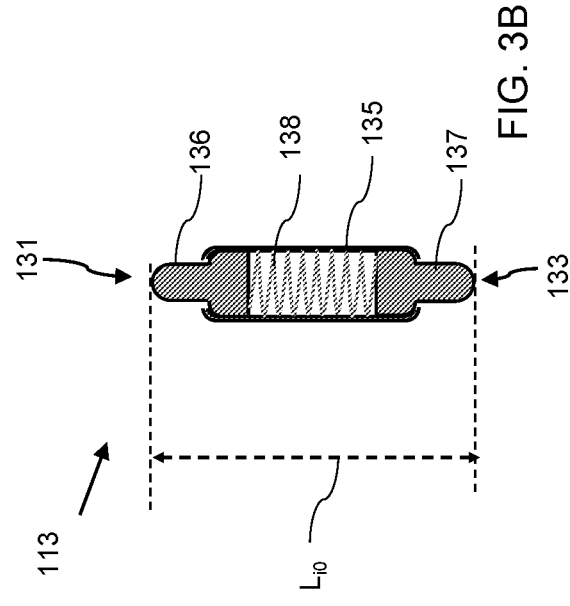
FIG. 3B is a vertical cross-section view of an interposer pin of the interposer structure shown in FIG. 3A according to an embodiment of the present disclosure.

FIG. 3B illustrates an example of an interposer pin 113 according to an embodiment of the present disclosure. Referring to FIG. 3B, the interposer pin 113 may include an outer barrel member 135 that may form the larger diameter central portion of the interposer pin 113 and a pair of plunger members 136 and 137 located partially inside of the outer barrel member 135 in a nested configuration. Each of the plunger members 136 and 137 includes a larger diameter portion located inside of the outer barrel member 135 and a smaller diameter portion that projects out from the outer barrel member 135 and forms the respective upper and lower portions 131 and 133 of the interposer pin 113. At least one of the plunger members 136 and 137 may be moveable with respect to the outer barrel member 135 (i.e., may be slidable along the length of the outer barrel member 135). A spring 138 inside the outer barrel member 135 may bias the plunger members 136 and 137 away from one another and towards the respective ends of the outer barrel member 135. Accordingly, when the interposer pin 113 is subjected to a compressive force along the length of the interposer pin 113 that exceeds the bias force of the spring 138, the plunger members 136 and 137 may slide towards one another within the outer barrel member 135, thereby resulting in an elastic deformation of the interposer pin 113. In particular, a length $L_i$ of the interposer pin 113 may decrease in response to a sufficient compressive force. In some embodiments, a length Lio of the interposer pin 113 prior being assembled into an interposer structure 109 as shown in FIG. 3A may be greater than the lengths of the interposer pins 113 (e.g., $L_{i1}$ in FIG. 2A) after being assembled into the interposer structure 109. The interposer pins 113 may thus be in a preloaded state when assembled into an interposer structure 109 as shown in FIG. 3A.

As noted above, the interposer pins 113 may be formed of a suitable electrically conductive material, such as a metal or metal alloy. In one non-limiting embodiment, the interposer pins 113 may be formed of a lead-copper alloy. Other suitable materials for the interposer pins 113 are within the contemplated scope of disclosure.

Figures 4A, 4B, 4C, 4D:
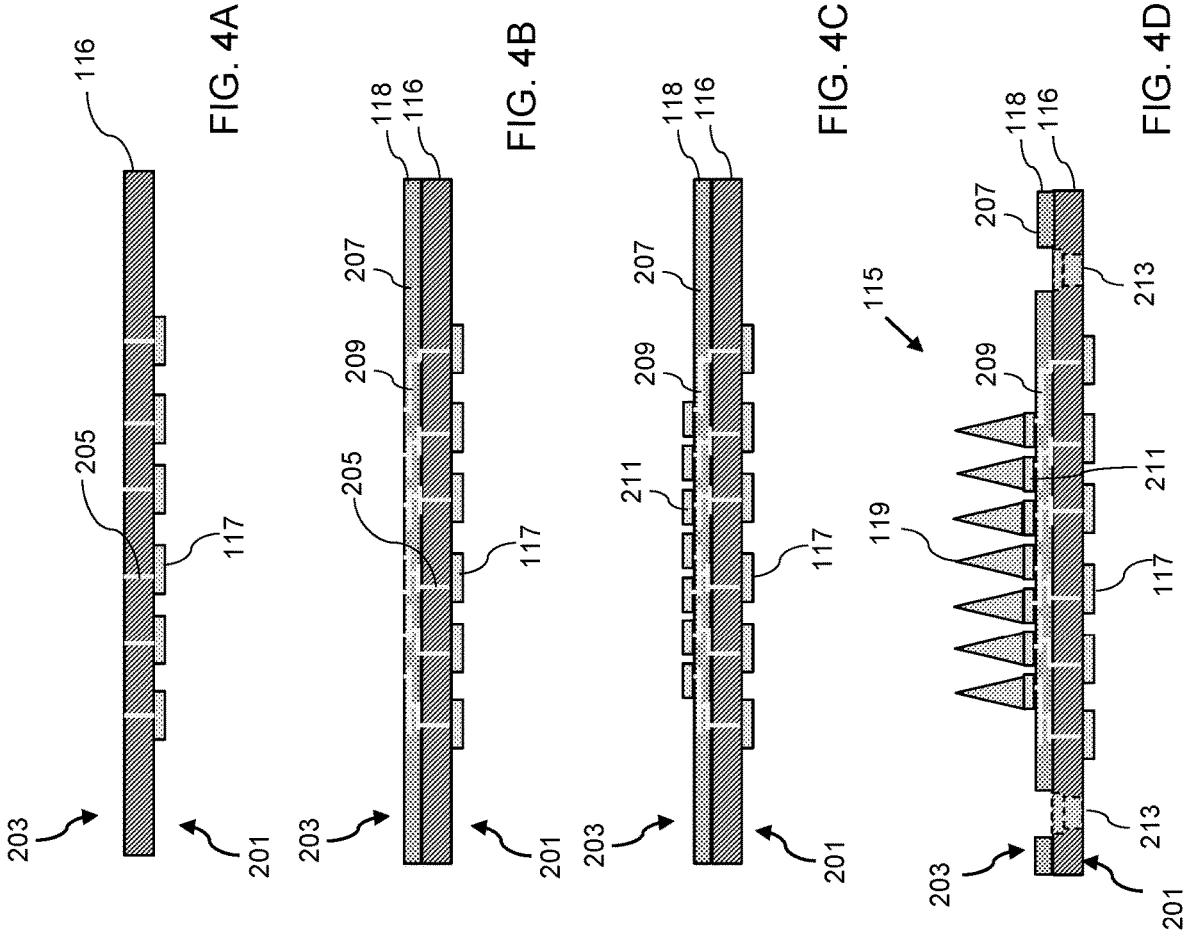
FIGS. 4A-4D are a sequential vertical cross-section views illustrating a process of forming a probe portion of a probe card according to various embodiments of the present disclosure.

FIGS. 4A-4D are sequential vertical cross-section views illustrating a process of forming a probe portion 115 of a probe card 102 according to various embodiments of the present disclosure. FIG. 4A illustrates a probe substrate 116 having a first surface 201 and a second surface 203. As discussed above, the probe substrate 116 may include a multi-layer substrate structure, such as a multi-layer ceramic (MLC) substrate and/or a multilayer organic (MLO) substrate. A multi-layer ceramic (MLC) substrate may include a laminate structure composed of multiple layers of a sintered ceramic-based material having conductive interconnect structures 205 (e.g., conductive vias) extending through the laminate structure. Suitable ceramic materials for an MLC substrate may include, for example, alumina ($Al_2O_3$), beryllium oxide (BeO), aluminum nitride (AlN), silicon nitride (SiN), silicon carbide (SiC), and/or mullite ($Al_6Si_2O_{13}$). Other suitable ceramic materials are within the contemplated scope of disclosure. Suitable materials for the interconnect structures 205 may include, for example, Cu, Au, Ag, W, Mo, Mn and the like, including combinations and alloys thereof. The MLC substrate may be fabricated using, for example, a thick film printing lamination process or a co-fired ceramic green sheet lamination process. Other suitable methods for fabricating an MLC substrate are within the contemplated scope of the invention.

A multi-layer organic (MLO) substrate may include a laminate structure composed of multiple layers of an organic resin material (e.g., polyimide, cyanate ester, BT-epoxy, PTFE, PPE, etc.) and optional filler and/or reinforcement material(s) that may be cured by application of heat and pressure to form a rigid substrate. Conductive interconnect structures 205 formed of a suitable metallic material (e.g., Cu) may extend through the laminate structure. In some embodiments, the conductive interconnect structures 205 may include conductive vias that may be formed by forming through-holes in the laminate structure using any suitable process, such as mechanical drilling, laser drilling, or an etching process through a photolithographically-patterned mask and providing a conductive material within the through-holes using a suitable deposition process, such as via electroplating.

Referring again to FIG. 4A, a plurality of electrical contacts 117, such as bonding pads, may be formed on the first surface 201 of the probe substrate 116. The electrical contacts 117 may be formed of a suitable conductive material, such as Cu, Ni, W, Al, Co, Mo, Ru, and the like, including combinations and alloys thereof. Other suitable materials for the electrical contacts 117 are within the contemplated scope of disclosure. In some embodiments, the electrical contacts 117 may be formed by depositing a layer of a conductive material over the first surface 201 of the probe substrate 116 using a suitable deposition process (e.g., a chemical vapor deposition (CVD) process, a physical vapor deposition (PVD) process, an atomic layer deposition (ALD) process, an electroplating process, or the like), and lithographically-patterning the layer of conductive material to form the plurality of electrical contacts 117 over the first surface 201 of the probe substrate 116. The electrical contacts 117 may contact the interconnect structures 205 within the probe substrate 116.

FIG. 4B illustrates a redistribution layer 118 formed over the second side surface 203 of the probe substrate 116 according to an embodiment of the present disclosure. The redistribution layer 118 may include a plurality of conductive interconnect structures 209 (e.g., metal lines and vias) embedded in a dielectric material matrix 207. The conductive interconnect structures 209 may contact the interconnect structures 205 within the probe substrate 116.

Referring to FIG. 4B, in some embodiments, the redistribution layer 118 may be formed by depositing one or more layers of a dielectric material over second side surface 203 and performing one or more metallization processes to form conductive interconnect structures 209 within each of the layers of dielectric material. For example, a first dielectric material layer may be deposited over the second side surface 203 using a suitable deposition process. The first dielectric material layer may include a suitable dielectric material, such as silicon oxide, silicon nitride, aluminum oxide, silicon carbide, a dielectric polymer material (e.g., polyimide (PI), benzocyclobutene (BCB), polybenzobisoxazole (PBO), etc.), including combinations thereof. Other suitable dielectric materials are within the contemplated scope of disclosure. The first dielectric material layer may be deposited using any suitable deposition process, such as chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, spin coating, vacuum lamination, or the like. The first dielectric material may be patterned, for example, by applying and patterning a photoresist layer over the upper surface of the first dielectric material layer, and by transferring the pattern in the photoresist layer into the first dielectric material layer using an etch process such as an anisotropic etch process. The etch process may provide a plurality of open regions, including trenches and via openings, within the first dielectric material layer. Following the etch process, the photoresist layer may be removed using a suitable process, such as by ashing or dissolution using a solvent.

Alternatively, the first dielectric material layer may include a photosensitive material that may be exposed through a patterned mask to transfer the mask pattern directly to the dielectric material layer. An etch process may then be used to form the plurality of open regions, including trenches and via openings, within the first dielectric material layer.

A first plurality of conductive interconnect structures 209 may be formed by providing a conductive material within the plurality of open regions (i.e., trenches and vias) formed in the first dielectric material layer. Suitable conductive materials for the first redistribution structures may include a metallic material, such as Cu, Ni, W, Co, Mo, Ru, etc., including alloys and combinations of the same. Other suitable metallic materials are within the contemplated scope of disclosure. The metallic material may be deposited over the first dielectric material layer and within the open regions in the first dielectric material layer using a suitable deposition process, such as, for example, physical vapor deposition (PVD), sputtering, chemical vapor deposition (CVD), atomic layer deposition (ALD), plasma-enhanced chemical vapor deposition (PECVD), electrochemical deposition (e.g., electroplating), or combinations thereof. Excess portions of the metallic material located over the upper surface of the first dielectric material layer may be removed via a planarization process (e.g., chemical mechanical planarization (CMP)) and/or an etching process. The remaining portion of the metallic material may form the first plurality of conductive interconnect structures 209 embedded within the first dielectric material layer. This process may optionally be repeated by depositing one or more additional dielectric material layers over the first dielectric material layer and the first plurality of conductive interconnect structures 209, lithographically patterning each of the additional dielectric material layers to form open regions (e.g., trenches and via openings) therethrough, and providing a conductive material within the plurality of open regions to form additional conductive interconnect structures 209 within each of the additional dielectric material layers. Accordingly, a redistribution layer 118 may be formed over the second side surface 203 of the probe substrate 116 that includes a plurality of conductive interconnect structures 209 within a dielectric material matrix 207.

FIG. 4C illustrates a plurality of electrical contacts 211, such as bonding pads, formed over the redistribution layer 118. The electrical contacts 211 may be formed of a suitable conductive material, such as Cu, Ni, W, Al, Co, Mo, Ru, and the like, including combinations and alloys thereof. Other suitable materials for the electrical contacts 211 are within the contemplated scope of disclosure. In some embodiments, the electrical contacts 211 may be formed by depositing a layer of a conductive material over redistribution layer 118 using a suitable deposition process (e.g., a chemical vapor deposition (CVD) process, a physical vapor deposition (PVD) process, an atomic layer deposition (ALD) process, an electroplating process, or the like), and lithographically-patterning the layer of conductive material to form the plurality of electrical contacts 211 over the redistribution layer 118. The electrical contacts 211 may contact the conductive interconnect structures 209 within the redistribution layer 118.

Alternatively, a dielectric material layer may be formed over the upper surface of the redistribution layer 118 and may be lithographically patterned as described above to form open regions therein, and a conductive material may be formed within the open regions to provide a plurality of discrete electrical contacts 211 embedded in a dielectric material layer over the upper surface of the redistribution layer 118.

Referring again to FIG. 4C, in various embodiments, the plurality of electrical contacts 211 formed over the redistribution layer 118 over the second side surface 203 of the probe substrate 116 may extend over a smaller area and may have a smaller center-to-center spacing (i.e., pitch) between adjacent electrical contacts 211 than the corresponding area and center-to-center spacing (i.e., pitch) of the electrical contacts 117 formed over the first side surface 201 of the probe substrate 116. In some embodiments, the pitch between adjacent electrical contacts 117 on the first side surface 201 of the probe substrate 116 may be greater than 50 μm, and the pitch between adjacent electrical contacts 211 over the redistribution layer 118 on the second side surface 203 of the probe substrate may be less than 50 μm. Accordingly, the redistribution layer 118 may provide a "fan-in" configuration in which the pitch between the electrical contacts 211 and between the probe pins 119 to be subsequently formed over the redistribution layer 118 on the second side surface 203 of the probe substrate 116 may be smaller than the pitch between the electrical contacts 117 and between the interposer pins 113 which contact the electrical contacts 117 in the assembled probe card 102.

FIG. 4D illustrates a probe portion 115 including a plurality of probe pins 119 formed over the electrical contacts 211. As discussed above, each of the probe pins 119 may have an elongate structure and may be composed of an electrically conductive material. In some embodiments, the probe pins 119 may have a composite structure composed of different metallic materials. In one non-limiting example, each of the probe pins 119 may include a core composed of a metallic material having high electrical conductivity, such as copper. A coating of a suitable metallic material, such as rhodium, may be provided over the core to improve the strength and durability of the probe pins 119. In some embodiments, the tip ends of the probe pins 119 that contact the DUT 101 may include a material that is resistant to oxidation, such as gold. Although FIG. 4C illustrates probe pins 119 having a conical shape, it will be understood that other suitable shapes for the probe pins 119 may be utilized.

In various embodiments, the probe pins 119 may be fabricated using any suitable method for manufacturing three-dimensional micro-scale structures composed of an electrically conductive material. In some embodiments, the probe pins 119 may be fabricated using a microelectromechanical system (MEMS) manufacturing technique. In some embodiments, the probe pins 119 may be fabricated using a high aspect ratio microstructure technology (HARMST) technique. In one non-limiting example, a LIGA technique may be utilized that may include applying a photosensitive material (e.g., a polymer photoresist) over the redistribution layer 118 and the electrical contacts 211, exposing select portions of the photosensitive material to radiation (e.g., UV or X-ray radiation) through a patterned mask, and developing the photosensitive material by chemically removing (e.g., dissolving) either the exposed or unexposed portions of the photosensitive material to provide a preform structure (e.g., a mold) having opening regions corresponding to the size and shape of the probe pins 119 to be subsequently formed. A conductive material (e.g., copper) may then be formed within the open regions by a suitable process, such as an electroplating process, and the remaining preform structure may be removed to provide the plurality of probe pins 119 over the electrical contacts 211 and the redistribution layer 118. Other suitable methods, such as laser or mechanical micromachining techniques, additive manufacturing methods, and/or subtractive manufacturing methods such as selective etching techniques, may be used to form the probe pins 119. In various embodiments, the plurality of probe pins 119 may be formed in situ over the electrical contacts 211 and the redistribution layer 118, or may be formed separately and bonded to the electrical contacts 211.

The process steps shown in FIGS. 4B-4D may be repeated multiple times using the same probe substrate 116. For example, as discussed above, in the event that one or more of the probe pins 119 become broken or defective, or where a change in the layout or configuration of the probe pins 119 is desired, the probe pins 119 and the redistribution layer 118 may be removed from the second side surface 203 of the probe substrate 116 (e.g., via one or more etching and/or mechanical removal processes), and the process steps shown in FIGS. 4B-4D may be repeated to form a new redistribution layer 118, electrical contacts 211 and probe pins 119 over the second side surface 203 of the probe substrate 116.

Referring again to FIG. 4D, openings 213, such as threaded openings, may be formed through the probe substrate 116 and the redistribution layer 118 for mounting the probe structure 115 to the lower portion 110*b* of the interposer structure 109 as shown in FIG. 1.

Figure 5:
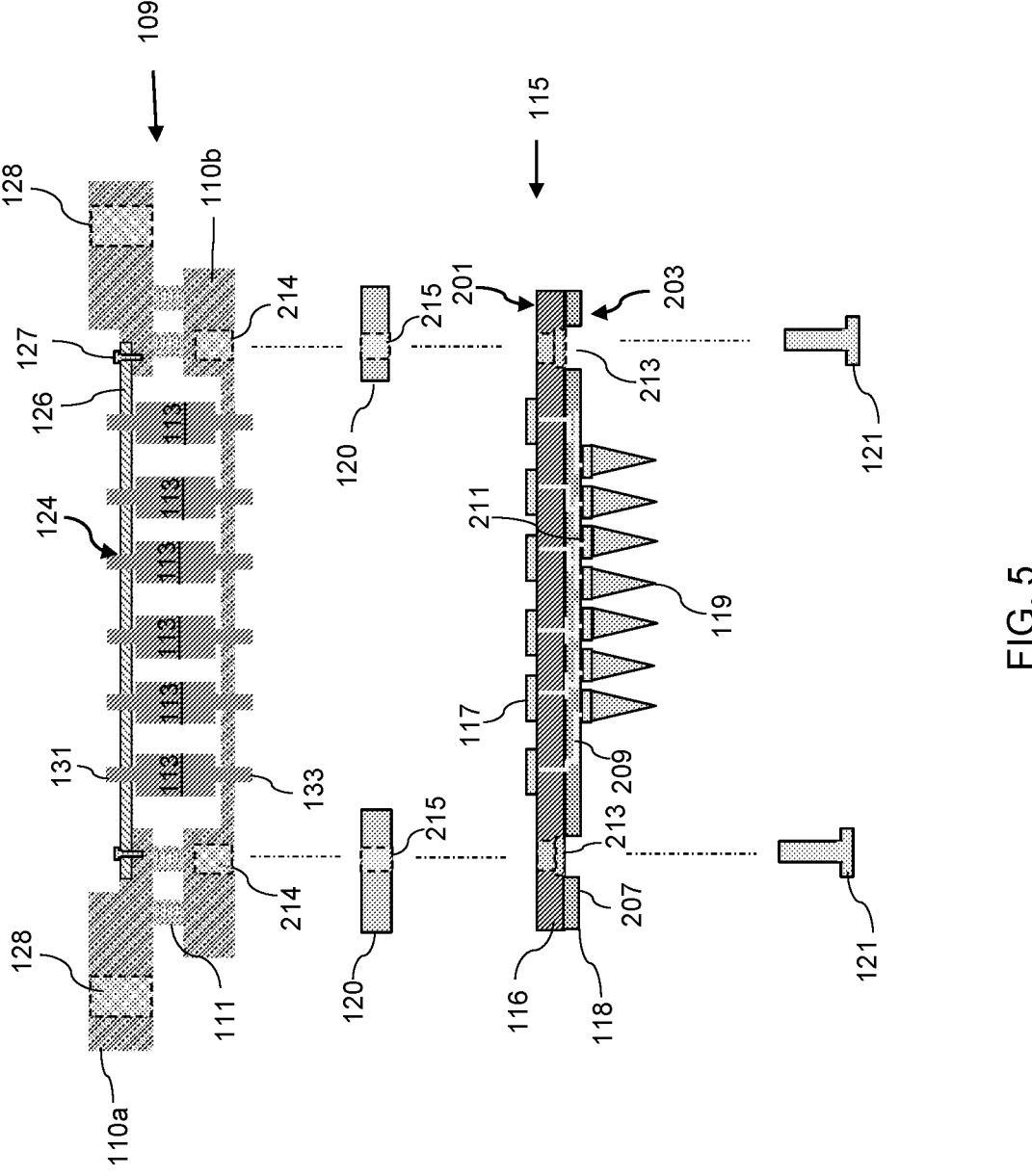
FIG. 5 is a vertical cross-section view illustrating an assembly process for a probe card including the mounting of a probe portion to an interposer portion of the probe card according to an embodiment of the present disclosure.
Figure 6:
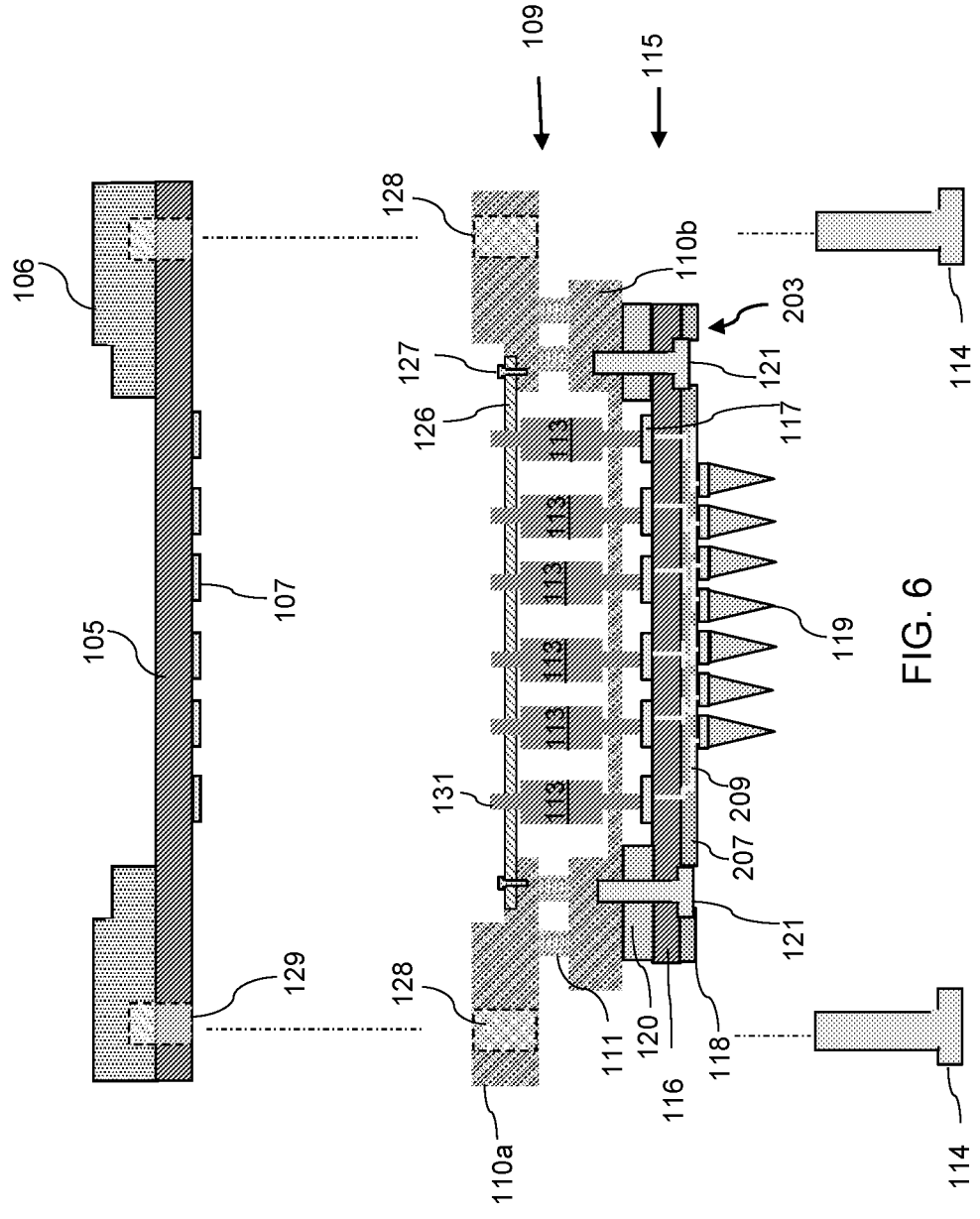
FIG. 6 is a vertical cross-section view illustrating an assembly process for a probe card including the mounting of a probe portion and interposer portion of the probe card to a circuit board and mounting portion of a circuit probe test system according to an embodiment of the present disclosure.

FIGS. 5 and 6 are vertical cross-section views illustrating a method of assembling a probe card 102 for a circuit probe test system 100 according to various embodiments of the present disclosure. FIG. 5 schematically illustrates the mounting of the probe portion 115 to the interposer portion 109. Referring to FIG. 5, one or more spacers 120 may be provided between the first side surface 201 (i.e., the back side surface) of the probe substrate 116 and the front side surface of the lower portion 110*b* of the interposer portion 109. The one or more spacers 120 may include openings 215, such as threaded openings, extending through the one or more spacers 120. Mechanical fasteners 121 may be inserted through the openings 213 in the probe portion 115, the openings 215 in the one or more spacers 120, and into the openings in the lower portion 110*b* of the interposer portion 109 to secure the probe portion 115 to the interposer portion 109. The lower portion 133 of each of the interposer pins 113 may contact a respective electrical contact 117 on the first side surface 201 (i.e., the back side surface) of the probe substrate 116.

FIG. 6 schematically illustrates the mounting of the interposer portion 109 and the probe portion 115 to the circuit board 105 and the mounting portion 106 of the circuit probe test system 100. Referring to FIG. 6, mechanical fasteners 114 may be inserted through the openings 128 in the upper portion 110*a* of the interposer structure 109, through openings 129 (e.g., threaded openings) in the circuit board 105 and into opening (e.g., threaded openings) in the mounting portion 106 to secure the interposer portion 109 and the probe portion 115 to the circuit board 105 and the mounting portion 106 of the circuit probe test system 100. In some embodiments, bonding material portion (e.g., solder balls) may be provided between the electrical contacts 107 on the front side surface of the circuit board 105 and the upper portions 131 of the interposer pins 113. A bonding process (e.g., a solder reflow process) may be used to bond the upper portions 131 of the interposer pins 113 to the electrical contacts 107 as shown in FIG. 1.

Although FIGS. 5 and 6 illustrate an assembly method in which the probe portion 115 is mounted to the interposer portion 109 prior to mounting the interposer portion 109 to the circuit board 105 and the circuit probe test system 100, it will be understood that other assembly methods may be utilized, such as methods that include mounting the interposer portion 109 to the circuit board 105 and/or the circuit probe test system 100 prior to mounting the probe portion 115 to the interposer portion 109.

Figures 7A, 7B, 7C:
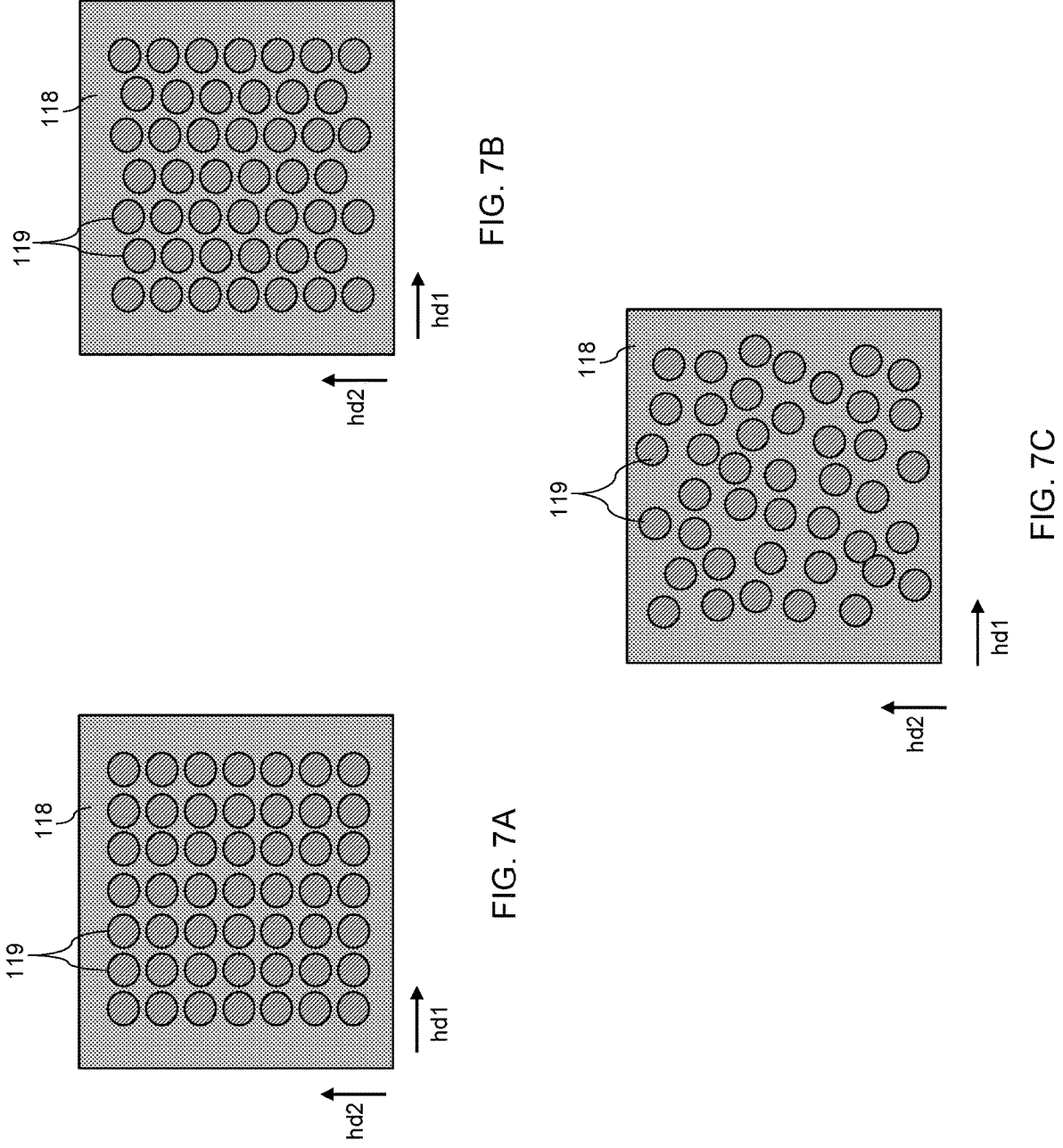
FIG. 7A is a bottom view of a probe portion of a probe card including a plurality of probe pins arranged in a regular, periodic two-dimensional array of probe pins according an embodiment of the present disclosure.
FIG. 7B is a bottom view of a probe portion of a probe card including a plurality of probe pins arranged in staggered two-dimensional array of probe pins including alternating columns of probe pins offset from one another according an embodiment of the present disclosure
FIG. 7C is a bottom view of a probe portion of a probe card including a plurality of probe pins arranged in an irregular array pattern according to an embodiment of the present disclosure.

FIGS. 7A-7C are bottom views of a probe portion 115 of a probe card illustrating a plurality of different configurations of the probe pins 119 according to various embodiments of the present disclosure. FIG. 7A illustrates the probe pins 119 configured in a regular, periodic two-dimensional rectangular array of probe pins 119 including rows of probe pins 119 extending along a first horizontal direction hd1, and columns of probe pins 119 extending along a second horizontal direction hd2. FIG. 7B illustrates an alternative configuration in which the probe pins 119 are arranged in a staggered array including multiple columns of probe pins 119 extending along one horizontal direction (i.e., hd2 in FIG. 7B), where the probe pins 119 in alternating columns are offset from one another. FIG. 7C illustrates yet another embodiment in which the probe pins 119 are arranged in an irregular array pattern. In other words, the center-to-center spacing (i.e., pitch) of the probe pins 119 in the irregular array pattern is non-uniform, such that a spacing between each probe pin 119 and its neighboring probe pins 119 may be arbitrary. The pixel pitch of the probe pins 119 may be defined as an average (e.g., mean) center-to-center spacing between each of the probe pins 119 and its neighboring probe pins 119, which in some embodiments may be less than 50 μm. In some embodiments, the irregular array pattern of the probe pins 119 may correspond to the pattern of electrical contacts on a DUT 101 that may undergo circuit probe testing using the probe pins 119.

Figure 8:
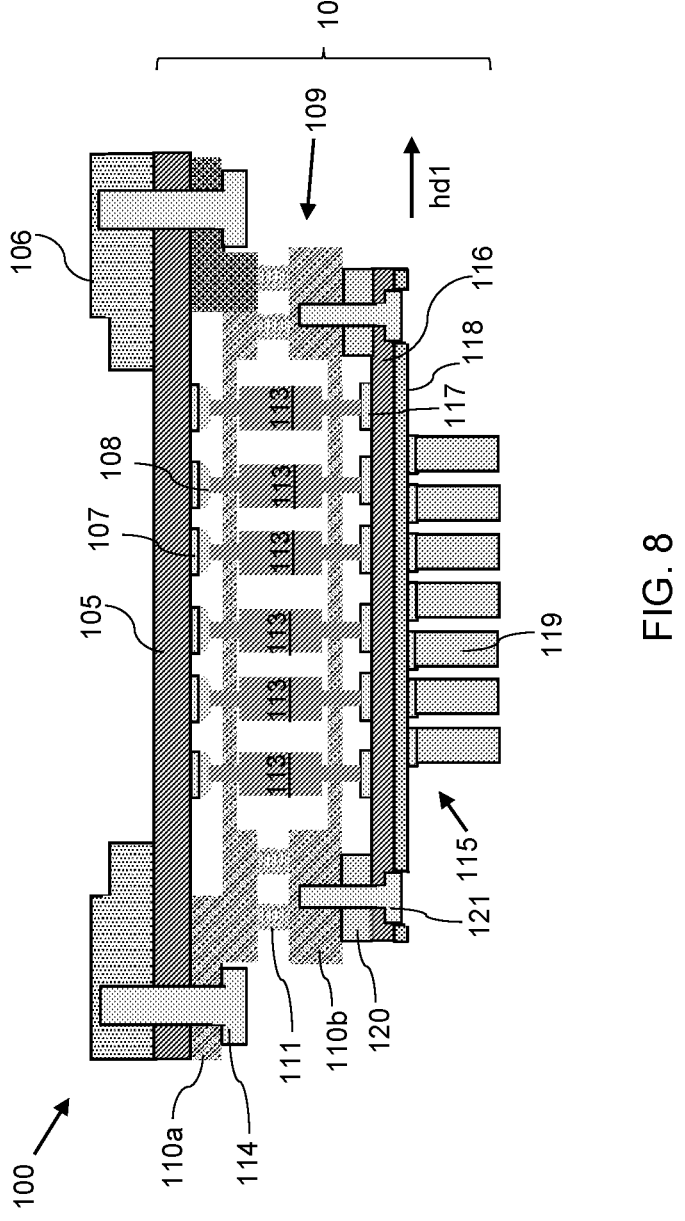
FIG. 8 is a vertical cross-section view of a portion of a circuit probe test system including a probe card having probe pins with a cylindrical shape according to an embodiment of the present disclosure.

FIG. 8 is a vertical cross-section view of a portion of a circuit probe test system 100 including a probe card 102 having probe pins 119 with a cylindrical shape according to another embodiment of the present disclosure. The circuit probe test system 100 shown in FIG. 8 may include equivalent components to the system 100 shown in FIG. 1. Thus, repeated discussion of like elements is omitted for brevity. The system 100 shown in FIG. 8 may differ from the system 100 of FIG. 1 in that each of the probe pins 119 may have a cylindrical shape rather than a conical shape as shown in FIG. 1.

Figure 9:
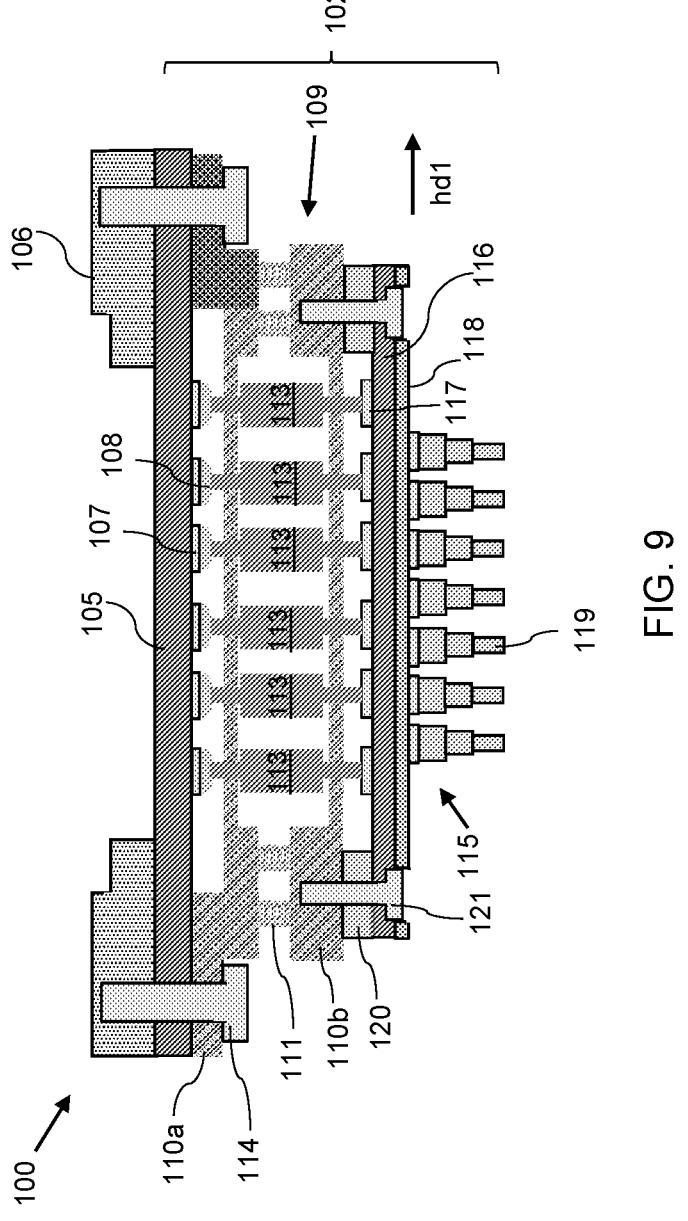
FIG. 9 is a vertical cross-section view of a portion of a circuit probe test system including a probe card having probe pins with a stepped-cylinder shape according to an embodiment of the present disclosure.

FIG. 9 is a vertical cross-section view of a portion of a circuit probe test system 100 including a probe card 102 having probe pins 119 with a stepped-cylinder shape according to yet another embodiment of the present disclosure. The circuit probe test system 100 shown in FIG. 9 may include equivalent components to the system 100 shown in FIG. 1. Thus, repeated discussion of like elements is omitted for brevity. The system 100 shown in FIG. 9 may differ from the system 100 of FIG. 1 in that each of the probe pins 119 may have a stepped-cylinder shape or tiered-cylinder shape rather than a conical shape as shown in FIG. 1. Accordingly, the diameter of the probe pins 119 may decrease in a stepwise manner as opposed to a continuous decrease as shown in FIG. 1. It will be understood that the probe pins 119 may have any suitable cross-sectional shape, such as a pyramid shape, a cuboid shape, a triangular prism shape, etc.

Figure 10:
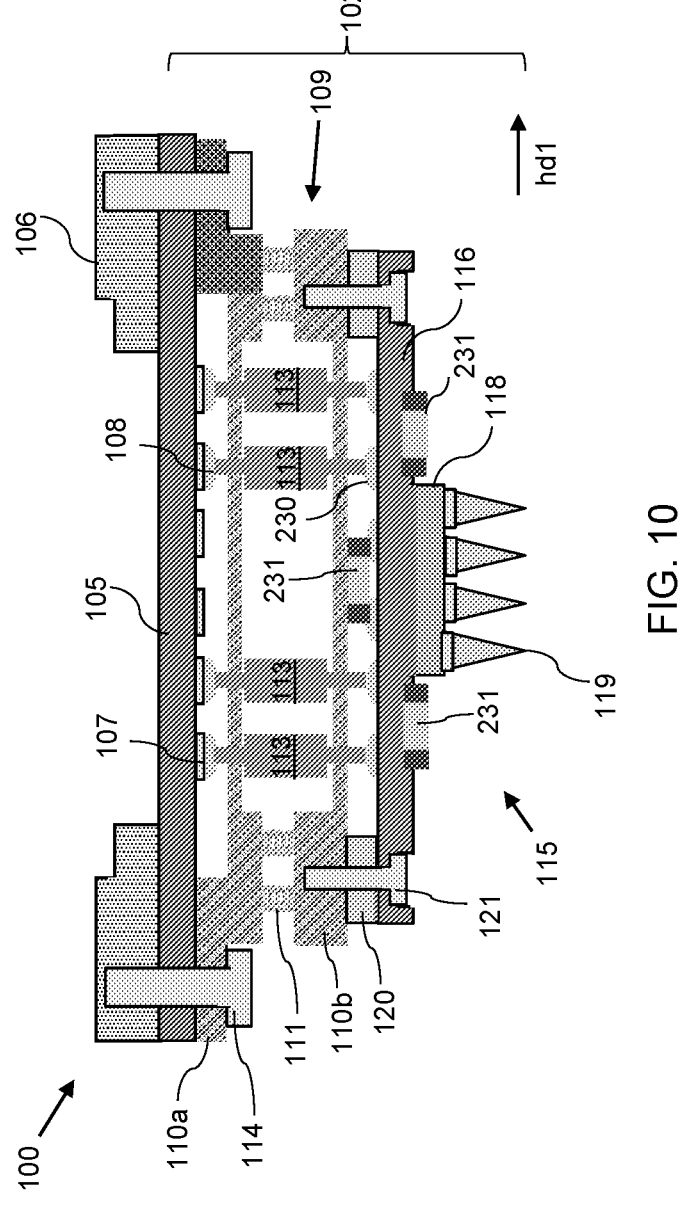
FIG. 10 is a vertical cross-section view of a portion of a circuit probe test system including a probe card having a plurality of decoupling capacitors on a probe substrate according to an embodiment of the present disclosure.

FIG. 10 is a vertical cross-section view of a portion of a circuit probe test system 100 including a probe card 102 according to yet another embodiment of the present disclosure. The circuit probe test system 100 shown in FIG. 10 may include equivalent components to the system 100 shown in FIG. 1. Thus, repeated discussion of like elements is omitted for brevity. The system 100 shown in FIG. 10 may differ from the system 100 of FIG. 1 in that the probe portion 115 may include one or more capacitors 231 mounted to the probe substrate 116. The embodiment of FIG. 10 illustrates a capacitor 231 mounted to the back side surface of the probe substrate 116 and a pair of capacitors 231 mounted to the front side surface of the probe substrate 116. The capacitors 231 may be decoupling capacitors that may improve electrical transmission in the probe card 102. The embodiment of FIG. 10 also differs from the embodiment of FIG. 1 in that the redistribution layer 118 and the probe pins 119 are located over a smaller region of the probe substrate 116. Further, the interposer pins 113 are electrically connected to peripheral regions of the back side surface of the probe substrate 116 but are not electrically connected to a central region of the back side surface of the probe substrate 116. In addition, both the interposer pins 113 and the capacitor 231 are electrically connected to the back side surface of the probe substrate 116 via bonding portions 230, which may be, for example, solder material portions.

FIG. 11 is a flow chart showing a method 300 of fabricating a probe card 102 for a circuit probe test system 100 according to various embodiments of the present disclosure. Referring to FIGS. 1, 2A-2B, 4B and 11, in step 301 of method 300, a redistribution layer 118 including a plurality of conductive interconnect structures 209 embedded in a dielectric material matrix 207 may be formed over a first surface 203 of a probe substrate 116. Referring to FIGS. 1, 2A-2B, 4D and 11, in step 303 of method 300, a plurality of probe pins 119 may be formed over the redistribution layer 118, where each probe pin 119 may electrically contact a conductive interconnect structure 209 of the redistribution layer 118. Referring to FIGS. 1, 2A-2B, 5 and 11, in step 305 of method 300, the probe substrate 116 may be mounted to an interposer structure 109 such that a plurality of interposer pins 113 may contact electrical contacts 117 on a second surface 201 of the probe substrate 116 that are electrically coupled to the conductive interconnect structures 209 of the redistribution layer 118, where a pitch $P_1$ between adjacent interposer pins 113 of the interposer structure 109 may be greater than a pitch $P_2$ between adjacent probe pins 119 of the plurality of probe pins 119.

Referring to all drawings and according to various embodiments of the present disclosure, a circuit probe test system 100 includes a circuit board 105 mounted to a mounting portion 106 of the circuit probe test system 100 and including a plurality of first electrical contacts 107 on a surface of the circuit board 105, an interposer structure 109 mounted to the circuit board 105 and including a plurality of interposer pins 113, each of the interposer pins having a first end that electrically contacts a first electrical contact 107 on the surface of the circuit board 105, a probe structure 115 mounted to the interposer structure 109, the probe structure 115 including a probe substrate 116 including a plurality of second electrical contacts 117 on a first surface 201 of the probe substrate 116, each of the interposer pins 113 having a second end that electrically contacts a second electrical contact 117 on the first surface 201 of the probe substrate 116, a redistribution layer 118 over a second surface 203 of the probe substrate 116 opposite the first surface 201, and a plurality of probe pins 119 over the redistribution layer 118, where a first pin pitch $P_1$ between the interposer pins 113 of the plurality of interposer pins 113 is greater than a second pin pitch $P_2$ between the probe pins 119 of the plurality of probe pins 119.

In an embodiment, the first pin pitch $P_1$ may be at least 50 μm and the second pin pitch $P_2$ may be less than 50 μm.

In another embodiment, a length dimension $L_i$ of each of the interposer pins 113 may be greater than a length dimension $L_p$ of each of the probe pins 119.

In another embodiment, the length dimension $L_p$ of each of the probe pins 119 is between 10 μm and 100 μm.

In another embodiment, the interposer structure 109 includes an upper portion 110a fixed to the circuit board 105, a lower portion 110b fixed to the probe structure 115, and at least one spring member 111 between the upper portion 110a and the lower portion 110b of the interposer structure 109.

In another embodiment, each of the interposer pins 113 includes a central portion that is confined between the upper portion 110a and the lower portion 110b of the interposer structure 109, where an upper portion 131 of each of the interposer pins 113 extends through an opening 124 in the upper portion 110a of the interposer structure 109 and electrically contacts a first electrical contact 107 on the surface of the circuit board 105, and a lower portion 133 of each of the interposer pins 113 extends through an opening 125 in the lower portion 110b of the interposer structure 109 and electrically contacts a second electrical contact 117 on the first surface 201 of the probe substrate 116.

In another embodiment, each of the interposer pins 113 may include a spring pin having an outer barrel member 135 forming the central portion of the interposer pin 113, a plunger member 136, 137 including a first portion located within the outer barrel member 135 and a second portion projecting out from an opening in the outer barrel member 135, and a spring member 138 located within the outer barrel member 135 and biasing the first portion of the plunger member 136, 137 towards the opening in the outer barrel member 135.

In another embodiment, the upper portion 131 of each of the interposer pins 113 is bonded to a first electrical contact 107 via a bonding material portion 108, and the lower portion 133 of each of the interposer pins 113 is not bonded to a second electrical contact 117 via a solder material portion.

In another embodiment, the probe portion 115 is detachably mounted to the interposer portion 109 via one or more mechanical fasteners 121.

In another embodiment, the redistribution layer 118 includes a plurality of conductive interconnect structures 209 embedded in a dielectric material matrix 207 and contacting each of the probe pins 119 such that there is a continuous signal transmission pathway between the circuit board 105 and each of the probe pins 119 via the interposer structure 109, the probe substrate 116 and the redistribution layer 118.

Another embodiment is drawn to a probe card 102 for a circuit probe test system 100 that includes a circuit board 105, an interposer structure 109 mounted to a front side surface of the circuit board 105, a probe substrate 116 mounted to a front side surface of the interposer structure 109, a redistribution layer 118 including a plurality of conductive interconnect structures 209 embedded in a dielectric material matrix 207 over a front side surface 203 of the probe substrate 116, and a plurality of probe pins 119 over the front side surface 203 of the redistribution layer 118, each probe pin 119 electrically connected to a conductive interconnect structure 207 of the redistribution layer 118 and an average center-to-center spacing $P_2$ of adjacent probe pins 119 of the plurality of probe pins 119 is less than 50 μm.

In an embodiment, an average center-to-center spacing $P_2$ of adjacent probe pins 119 of the plurality of probe pins 119 is less than 40 μm.

In another embodiment, a length $L_p$ of each of the probe pins is between 10 μm and 100 μm and the interposer structure 109 includes sufficient elastic deformability to provide an overtravel distance of the probe card that is at least 50 μm.

In another embodiment, the probe pins 119 are arranged in a two-dimensional array comprising regularly spaced rows and columns of probe pins 119.

In another embodiment, the probe pins 119 are arranged in a two-dimensional array comprising rows or columns of arrays extending along a first horizontal direction hd1, where probe pins 119 in alternating rows or columns are offset with respect to probe pins 119 in adjacent rows or columns.

In another embodiment, the probe pins 119 are arranged in an irregular array in which the center-to-center spacing $P_2$ of probe pins 119 in the array is non-uniform.

In another embodiment, the probe substrate 116 is a multi-layer ceramic or a multi-layer organic substrate, at least one decoupling capacitor 231 is located on the probe substrate 116, and the plurality of probe pins 119 have at least one of a conical shape, a cylindrical shape, and a stepped-cylinder shape.

Another embodiment is drawn to a method of fabricating a probe card 102 for a circuit probe test system 100 that includes forming a redistribution layer 118 having a plurality of conductive interconnect structures 209 embedded in a dielectric material matrix 207 over a first surface 203 of a probe substrate 116, forming a plurality of probe pins 119 over the redistribution layer 118, where each probe pin 119 electrically contacts a conductive interconnect structure 209 of the redistribution layer 118, mounting the probe substrate 116 to an interposer structure 109 such that a plurality of interposer pins 113 of the interposer structure 109 contact electrical contacts 117 on a second surface 201 of the probe substrate 116 that are electrically coupled to the conductive interconnect structures 209 of the redistribution layer 118, where a pitch $P_1$ between adjacent interposer pins 113 of the interposer structure 109 is greater than a pitch $P_2$ between adjacent probe pins 119 of the plurality of probe pins 119.

In one embodiment, the probe substrate 116 is mounted to the interposer structure 109 using one or more mechanical fasteners 121, and the method further includes removing the one or more mechanical fasteners 121 to detach the probe substrate 116 from the interposer structure 109, removing the probe pins 119 and the redistribution layer 118 from over the first surface 203 of the probe substrate 116, forming a second redistribution layer 118 including a second plurality of conductive interconnect structures 209 embedded in a dielectric material matrix 207 over the first surface 203 of the probe substrate 116, forming a second plurality of probe pins 119 over the redistribution layer 118, where each probe pin 119 of the second plurality of probe pins 119 electrically contacts a second conductive interconnect structure 209 of the second redistribution layer 118, and remounting the probe substrate 116, the second redistribution layer 118 and the second plurality of probe pins 119 to the interposer structure 109 using one or more mechanical fasteners 121.

In another embodiment, the plurality of probe pins 119 are formed using a microelectromechanical system (MEMS) fabrication process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit probe test system, comprising:
a circuit board mounted to a mounting portion of the circuit probe test system and including a plurality of first electrical contacts on a surface of the circuit board;
an interposer structure mounted to the circuit board and including a plurality of interposer pins, the interposer structure comprising:
an upper portion mounted to the circuit board, the upper portion comprising a cover portion having a plurality of first openings extending through the cover portion; and
a lower portion having a plurality of second openings extending through the lower portion, wherein the interposer pins comprise central portions confined within an enclosure located between the cover portion of the upper portion of the interposer structure and the lower portion of the interposer structure, upper portions of the interposer pins extend through the first openings above an upper surface of the cover portion, and lower portions of the interposer pins extend through the second openings below a lower surface of the lower portion of the interposer structure, at least one of the plurality of interposer pins having a first end that electrically contacts a first electrical contact on the surface of the circuit board;
a probe structure mounted to the lower portion of the interposer structure, the probe structure comprising:
a probe substrate comprising a plurality of second electrical contacts on a first surface of the probe substrate, at least one of the plurality of interposer pins having a second end that electrically contacts a second electrical contact on the first surface of the probe substrate;
a redistribution layer over a second surface of the probe substrate opposite the first surface; and
a plurality of probe pins over the redistribution layer, wherein a first pin pitch between the interposer pins of the plurality of interposer pins is greater than a second pin pitch between the plurality of probe pins, wherein the diameter of at least one of the plurality of probe pins decreases as the distance from the redistribution layer increases.

2. The circuit probe test system of claim 1, wherein the first pin pitch is at least 50 μm and the second pin pitch is less than 50 μm.

3. The circuit probe test system of claim 1, wherein a length dimension of at least one of the interposer pins is greater than a length dimension of at least one of the plurality of probe pins.

4. The circuit probe test system of claim 3, wherein the length dimension of each of the plurality of probe pins is between 10 μm and 100 μm.

5. The circuit probe test system of claim 1, wherein the interposer structure comprises at least one spring member between the upper portion and the lower portion of the interposer structure.

6. The circuit probe test system of claim 1, wherein at least one of the interposer pins comprises a spring pin comprising an outer barrel member forming the central portion of the interposer pin, a plunger member including a first portion located within the outer barrel member and a second portion projecting out from an opening in the outer barrel member, and a spring member located within the outer barrel member and biasing the first portion of the plunger member towards the opening in the outer barrel member.

7. The circuit probe test system of claim 1, wherein the upper portion of at least one of the interposer pins is bonded to a first electrical contact via a solder material portion, and the lower portion of at least one of the interposer pins is not bonded to a second electrical contact via a solder material portion.

8. The circuit probe test system of claim 1, wherein the probe structure is detachably mounted to the interposer structure via one or more mechanical fasteners.

9. The circuit probe test system of claim 1, wherein the redistribution layer comprises a plurality of conductive interconnect structures embedded in a dielectric material matrix and contacting at least one of the plurality of probe pins such that there is a continuous signal transmission pathway between the circuit board and at least one of the plurality of probe pins via the interposer structure, the probe substrate and the redistribution layer.

10. A probe card for a circuit probe test system, comprising:
   a circuit board;
   an interposer structure mounted to a front side surface of the circuit board;
   a probe substrate mounted to a front side surface of the interposer structure;
   a redistribution layer comprising a plurality of conductive interconnect structures embedded in a dielectric material matrix over a front side surface of the probe substrate; and
   a plurality of probe pins over the front side surface of the redistribution layer, at least one probe pin of the plurality of probe pins is electrically connected to a conductive interconnect structure of the redistribution layer and an average center-to-center spacing of adjacent probe pins of the plurality of probe pins is less than 50 μm, wherein the interposer structure is elastically deformable such that the probe substrate mounted to the front side of the interposer structure is vertically displaced towards the front side surface of the circuit board in response to a force applied to the plurality of probe pins, and at least one of the plurality of probe pins has a diameter that decreases as the distance from the redistribution layer increases.

11. The probe card of claim 10, wherein the average center-to-center spacing of adjacent probe pins of the plurality of probe pins is less than 40 μm.

12. The probe card of claim 11, wherein a length of at least one of the plurality of probe pins is between 10 μm and 100 μm and the interposer structure includes sufficient elastic deformability to provide an overtravel distance of the probe card that is at least 50 μm.

13. The probe card of claim 10, wherein the plurality of probe pins are arranged in a two-dimensional array comprising regularly spaced rows and columns of probe pins.

14. The probe card of claim 10, wherein the plurality of probe pins are arranged in a two-dimensional array comprising rows or columns of arrays extending along a first horizontal direction, wherein probe pins in alternating rows or columns are offset with respect to probe pins in adjacent rows or columns.

15. The probe card of claim 10, wherein the plurality of probe pins are arranged in an irregular array in which the center-to-center spacing of the plurality of probe pins in the array is non-uniform.

16. The probe card of claim 10, wherein:
   the probe substrate comprises a multi-layer ceramic or a multi-layer organic substrate;
   at least one decoupling capacitor is located on the probe substrate; and
   the plurality of probe pins have at least one of a conical shape, a cylindrical shape, and a stepped-cylinder shape.

17. A circuit probe test system, comprising:
   a circuit board mounted to a mounting portion of the circuit probe test system and including a plurality of first electrical contacts on a surface of the circuit board;
   an interposer structure mounted to the circuit board and including a plurality of elastically deformable interposer pins;
   a probe structure mounted to the interposer structure, the probe structure comprising:
   a probe substrate comprising a plurality of second electrical contacts on a first surface of the probe substrate;
   a redistribution layer over a second surface of the probe substrate opposite the first surface; and
   a plurality of probe pins over the redistribution layer, wherein the elastically deformable interposer pins are configured to electrically connect the first electrical contacts on the surface of the circuit board to respective second electrical contacts on the first surface of the probe substrate, the elastically deformable interposer pins are bonded to the first electrical contacts via solder connections, and the elastically deformable interposer pins are not bonded to the second electrical contacts via solder connections, and an average center-to-center spacing between adjacent elastically deformable interposer pins is different than an average center-to-center spacing between adjacent probe pins, wherein at least one of the plurality of probe pins has a diameter that decreases as the distance from the redistribution layer increases.

18. The circuit probe test system of claim 17, wherein a length of at least one of the plurality of probe pins is less than the length of at least one of the elastically deformable interposer pins.

19. The circuit probe test system of claim 17, wherein the average center-to-center spacing between adjacent elastically deformable interposer pins is ≥50 μm and the average center-to-center spacing between adjacent probe pins is ≤40 μm.

20. The circuit probe test system of claim 1, wherein the second pin pitch is 36 μm or less.

* * * * *